United States Patent [19]

Funada et al.

[11] Patent Number: 5,681,648

[45] Date of Patent: Oct. 28, 1997

[54] PRINTED WIRING BOARD AND METHOD FOR PREPARING THE SAME

[75] Inventors: Yoshitsugu Funada; Koji Matsui, both of Tokyo, Japan

[73] Assignee: NEC Corporation, Tokyo, Japan

[21] Appl. No.: 594,297

[22] Filed: Jan. 30, 1996

[30] Foreign Application Priority Data

Jan. 30, 1995 [JP] Japan ................................. 7-012532

[51] Int. Cl.$^6$ ................. B32B 3/00; B32B 9/00; B05D 3/04

[52] U.S. Cl. ............... 428/209; 428/469; 428/472.2; 428/701; 428/699; 428/698; 428/702; 428/901; 427/304

[58] Field of Search ................. 428/469, 472, 428/209, 210, 901, 701, 702, 467, 472.2, 698, 699; 427/304

[56] References Cited

U.S. PATENT DOCUMENTS

| | | |
|---|---|---|
| 3,335,050 | 8/1967 | Makowski et al. ............... 428/469 |
| 4,535,029 | 8/1985 | Intrater et al. ............... 428/469 |
| 4,761,303 | 8/1988 | Ruszczyk et al. ............... 428/901 |
| 4,772,080 | 9/1988 | Tustison ............... 428/472 |
| 5,389,446 | 2/1995 | Yamanishi et al. ............... 428/472 |

*Primary Examiner*—Cathy F. Lam
*Attorney, Agent, or Firm*—Young & Thompson

[57] ABSTRACT

The present invention provides a novel printed wiring board which has an insulating substrate. The printed wiring board also has a metal compound layer formed on a surface of the insulating substrate, wherein the metal compound layer is made of a metal compound having a sufficient insulating property and showing a reduction to a metal. The metal compound layer has a surface formed thereon with a metal wiring pattern which is formed by selective reduction of the above metal compound of the metal compound layer. The printed wiring board also has a palladium-displacement plating layer formed on the metal wiring pattern. The printed wiring board also has an electroless plating layer.

2 Claims, No Drawings

PRINTED WIRING BOARD AND METHOD FOR PREPARING THE SAME

BACKGROUND OF THE INVENTION

The present invention relates to an improved printed circuit board and a method for preparing the same, and more particularly to am improved additive method for preparing a printed circuit board from an insulation substrate.

Methods for preparing a printed wiring board may be classified into the following two methods. One is the subtraction method wherein a copper foil is put on an insulation substrate and then the copper foil is selectively removed by a chemical treatment so as to define conductivity patterns and insulating regions. Another is the additive method wherein a conductive material is selectively extracted on an insulating substrate by electroless plating to define conductive patterns.

In recent years, the high density packaging of electronic devices has been on the advance, with which the requirement for fine patterns of the printed wiring board has been on the increase. The subtractive method has widely been used, but not responsible for forming fine patterns. In place of the subtractive method, the additive method receives attention as methods responsible for forming fine patterns and particularly a full additive method is attractive and receives a great deal of attention in view of both capability of forming the required fine patterns and a low cost.

The basic processes currently utilized are CC-4 method and AP-II method. The former method is simple processes free from any process for applying a catalyst on an insulating substrate, wherein the insulating substrate has previously contained catalyst cores for electroless plating. However, such substrate is somewhat expensive since the substrate contains an excess amount of the catalyst.

In contrast, the latter method uses an insulating substrate containing no catalyst. This increase the degree of freedom for selection of materials. It is thus required to apply the catalyst on the insulating substrate. This method is however engaged with the following disadvantageous. In the process of applying the catalyst, the catalyst shows an insufficient dispersion contrary to the former method, for example, CC-4 method. The catalyst is likely to reside under a plating resist. The insufficient dispersion and the residuary causes a lowering of surface resistance. In order to remove the above disadvantages, it was proposed that after the plating resist is formed, the catalyst is applied onto the insulating substrate and then any excess catalyst on the surface of the resist is removed. This method is disclosed in Japanese laid-open Patent application No. 4-118992. As an alternative method, it was further proposed to use a resist which is made of water-repellent resin or receive water-repellent treatment so as to prevent adhesion of the catalyst on the surface of the resist. This method is disclosed in Japanese laid-open Patent Application No. 1-87781. This method has advantages as showing a less adhesion property for limited catalysts only.

In the above circumstances, it had been required to develop a novel printed wiring board which is inexpensive and has an allow ability of fine pattern formation with no plating deposition nor surface resistance reduction due to the adhesion of the catalyst on the plating resist surface as well as a method for forming the same.

SUMMARY OF THE INVENTION

Accordingly, it is an object of the present invention to provide a novel printed wiring board suitable for fine pattern formations, which is free from the disadvantages as described above.

It is a further object of the present invention to provide a novel printed wiring board free from any adhesion of catalyst on a resist surface.

It is a furthermore object of the present invention to provide a novel printed wiring board which is free from any plating deposition.

It is a furthermore object of the present invention to provide a novel printed wiring board which is free from any lowering of a surface resistance.

It is a furthermore object of the present invention to provide a novel printed wiring board which is inexpensive.

It is another object of the present invention to provide a novel printed wiring board suitable for fine pattern formations, which is free from the disadvantages as described above.

It is still another object of the present invention to provide a novel printed wiring board which is free from any plating deposition.

It is yet another object of the present invention to provide a novel printed wiring board which is free from any lowering of a surface resistance.

It is further another object of the present invention to provide a novel printed wiring board which is inexpensive.

The above and other objects, features and advantages of the present invention will be apparent from the following descriptions.

The present invention provides a novel printed wiring board which has an insulating substrate. The printed wiring board also has a metal compound layer formed on a surface of the insulating substrate, wherein the metal compound layer is made of a metal compound having a sufficient insulating property and showing a reduction to a metal. The metal compound layer has a surface formed thereon with a metal wiring pattern which is formed by selective reduction of the above metal compound of the metal compound layer. The printed wiring board also has a palladium-displacement plating layer formed on the metal wiring pattern. The printed wiring board also has an electroless plating layer formed on the palladium-displacement plating layer.

The present invention also provides a method for forming novel printed wiring board which .comprises the following steps. An additive is applied on a surface of an: insulating substrate. The insulating substrate is then immersed into a solution containing an oxidizing agent to make a surface of the applied additive rough. A metal compound layer is formed on the rough surface of the additive, wherein the metal compound layer is made of a metal compound which shows both a reduction to a metal and a sufficient insulation property. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

The present invention also provides another method for forming novel printed wiring board which comprises the following steps. An additive having particles of a metal compound is applied on a surface of an insulating substrate, wherein the metal compound shows both a sufficient insulation property and a reduction to a metal. The insulating substrate is then immersed into a solution containing an oxidizing agent to make a surface of the applied additive rough and simultaneously expose the metal compound particles on a surface of the additive so as to form the metal compound layer with a rough surface on the additive. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

The present invention also provides still another method for forming novel printed wiring board which comprises the following steps. An insulating substrate is prepared which contains particles of a metal compound which shows both a sufficient insulation property and a reduction to a metal. The insulating substrate is then immersed into a solution containing an oxidizing agent to make a surface of the substrate rough and simultaneously expose the metal compound particles on the surface of the substrate so as to form the metal compound layer with a rough surface on the substrate. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

DISCLOSURE OF THE INVENTION

The present invention provides a novel printed wiring board which has an insulating substrate. The printed wiring board also has a metal compound layer formed on a surface of the insulating substrate, wherein the metal compound layer is made of a metal compound having a sufficient insulating property and showing a reduction to a metal. The metal compound layer has a surface formed thereon with a metal wiring pattern which is formed by selective reduction of the above metal compound of the metal compound layer. The printed wiring board also has a palladium-displacement plating layer formed on the metal wiring pattern. The printed wiring board also has an electroless plating layer formed on the palladium-displacement plating layer.

The present invention also provides a method for forming novel printed wiring board which comprises the following steps. An additive is applied on a surface of an insulating substrate. The insulating substrate is then immersed into a solution containing an oxidizing agent to make a surface of the applied additive rough. A metal compound layer is formed on the rough surface of the additive, wherein the metal compound layer is made of a metal compound which shows both a reduction to a metal and a sufficient insulation property. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

The present invention also provides another method for forming novel printed wiring board which comprises the following steps. An additive having particles of a metal compound is applied on a surface of an insulating substrate, wherein the metal compound shows both a sufficient insulation property and a reduction to a metal. The insulating substrate is then immersed into a solution containing an oxidizing agent to make a surface of the applied additive rough and simultaneously expose the metal compound particles on a surface of the additive so as to form the metal compound layer with a rough surface on the additive. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

The present invention also provides still another method for forming novel printed wiring board which comprises the following steps. An insulating substrate is prepared which contains particles of a metal compound which shows both a sufficient insulation property and a reduction to a metal. The insulating substrate is then immersed into a solution containing an oxidizing agent to make a surface of die substrate rough and simultaneously expose the metal compound particles on the surface of the substrate so as to form the metal compound layer with a rough surface on the substrate. A plating resist film is selectively formed on the metal compound layer. The metal compound layer is selectively reduced by using the plating resist film as a mask to selectively form a metal wiring pattern on the metal compound layer. A palladium-displacement plating layer is formed on the metal wiring pattern by a palladium displacement plating wherein the plating resist film is used as a mask. An electroless metal plating layer is then formed on the palladium-displacement plating layer by using the plating resist film as a mask, wherein palladium in the palladium-displacement plating layer is used as a catalyst core to thereby form conductive circuits on the insulating substrate.

The above methods are capable of formation of fine pattern by electroless plating at a low cost and free from any plating deposition or any lowering of a surface resistance due to adhesion of catalyst on the plating resist surface.

The above present inventions will further be described in detail. Metal salts and metal oxides are available as a metal compound. There are two different methods for forming the metal compound layer on the insulting substrate. In a first method, the metal salt is dissolved into a solvent such as water solvent or alcohol solvent. This solvent is applied onto a surface of the insulating substrate. Alternatively, the insulating substrate is immersed into the above solvent. The substrate is then dried and further, if any, subjected to a heat treatment. Generally, the metal salts are dissolved rate water solvents or alcohol solvents, for which reason the treatment to the surface of the substrate by such solutions results in the formation of uniform layers.

Available metal salts are zinc nitrate, nickel nitrate, iron nitrate, copper nitrate, zinc sulfate, nickel sulfate, iron sulfate, copper sulfate, zinc oxalate, nickel oxalate, iron oxalate, copper oxalate, zinc acetic acid, nickel acetic acid, iron acetic acid and copper acetic acid. The layer of the metal salts is formed on the rough surface of the additive.

As an additive resin, commercially available thermosetting resins such as phenol resins, epoxy resins, epoxyacrylate resins, melamine resins, and melamine resins are available. It may be possible to add a diene rubber or a nitric rubber to the above additive resin.

The above additive resins are dissolved into organic solvents such as acetone solvents MEK solvents to form additive solutions. The dissolved additive resins are applied by a roll coater, a bar coater a certain flow coating method and a dipping method. The applied additive resins are dried to form an additive layer having a thickness of 15–50 micrometers.

The above additive layer is then immersed into a solution containing an oxidizing agent to make a surface of the additive layer rough. Generally, the additive contains particles of calcium carbonate to obtain the rough surface of the additive layer. The rough surface of the additive layer causes an anchor effect which improves an adhesion between a conductor and the substrate. As an oxidizing agent, permanganate, chromic acid anhydride, chromate, chromic acid-sulfuric acid, chromic acid-sulfuric acid-phosphoric acid and the like are available and preferable. It is possible, if necessary, to subject the substrate with the additive layer to a treatment using dimethylformamide and the like in order to swell the additive layer before the additive layer is immersed into five solution containing the oxidizing agent. This treatment is particularly effective to improve an adhesion with the plating film when the additive free from the diene based rubber is used.

Alternatively, it is available that the metal compound particles are mixed and dispersed uniformly into the additive to be applied onto the surface of the insulating substrate before the surface of five additive layer is made rough and surfaces of the particles are exposed. As metal oxide particles, zinc oxide particles, nickel oxide particles, iron oxide particles, copper oxide particles, and magnesium oxide particles are available. Those particles are available to cause the above-described anchor effect in place of the calcium carbonate particles. The diameter of the particle is in the range of 0.1–10 micrometers, particularly in the range of 1–5 micrometers. If the diameter of the particles is less than 0.1 micrometers, then a bonding force between the additive layer and the plating metal is lowered. If the diameter of the particles is more than 10 micrometers, the accuracy of fine wiring patterns is deteriorated. It is preferable that the content of the particles in the additive is in the range of 10–80 percents by volume. It is further preferable that the content of the particles in the additive is in the range of 30–60 percents by volume. If the content of the particles in the additive is less than 10 percents by volume, then an exposed surface area of the particles in the additive is sufficient. If the content of the particles in the additive is more than 80 percents by volume, then the additive layer is fragile.

As an additive resin, commercially available thermosetting resins such as phenol resins, epoxy resins, epoxyacrylate resins, melamine resins, and melamine resins are available. It may be possible to add a diene rubber or a nitric rubber to the above additive resin.

The above additive resins are dissolved into organic solvents such as acetone solvents MBK solvents to form additive solutions. The dissolved additive resins are applied by a roll coater, a bar coater a curtain flow coating method and a dipping method. The applied additive resins are dried to form an additive layer having a thickness of 15–50 micrometers.

The above additive layer is then immersed into a solution including metal oxide particles, wherein the metal oxide particles are uniformly mixed and dispersed into the solvent in order to make a surface of the additive layer rough and expose the particle surfaces.

A plating resist film is formed on the metal compound layer except for an region on which wiring patterns will have to be formed, so as to prevent the deposition of the plating in a Inter electroless plating process. The plating resist may be formed by a screen printing method or an offset printing method if a patch of the wiring pattern is relatively large. If a fine wiring pattern is required, then the plating resist may be formed by photoformation using dry films and liquid type photo-sensitive resists. As the dry film, it may possible to use S-22 and OBZ-4000 commercially available from Taiyo Ink co., Ltd. and Tokyo Applied Chemical Industries Co., Ltd. respectively. As a liquid type photo-sensitive resist, it may possible to use SR-3000 commercially available from Hitachi Kasei Kogyo co., Ltd.

As a reducing agent which reduces the metal compounds, boron compounds such as $H_2$, HI, CO, sodium boron hydride, potassium boron hydride, dimethyl aminoborane, and borane ammonium are available. Various reduction methods using various reduction reactions are available to match the reducing agents. $H_2$ gas is used, the reduction reaction is caused by heating the substrate up to at a temperature of approximately 200° C. in $H_2$ gas atmosphere. If sodium boron hydride is contained at approximately 1 g/l of in the solution, the reduction is caused by dipping the substrate in the solution for a few minutes.

The reduction reaction is caused on the surface of file metal compound layer. The reduced surface of the metal compound layer is then subjected to the palladium-displacement plating to deposit palladium which acts as a catalyst core doe electroless plating. Although the plating process follows the reduction process, it may be possible to was the reduced surface of the substrate by acids in order to improve both the deposition of the plating and the adhesion between a plating layer and the substrate. Whereas the method for the palladium-displacement plating is not limited, it is available to dip the substrate for a few minutes into a hydrochloride acidic solution having a pH value in the range of 1–3 and containing palladium chloride at 0.0005–0.005 Mol/l.

Subsequently, the electroless plating process is carried out. Whereas the material of the plating is not limited, then it is preferable to use Cu and Ni normally used for interconnections or wiring in view of the cost. The normal method for plating is available. When Cu is plated, then it is possible to use a sulfate plating bath, a copper pyrosulfate plating bath and a copper cyanide bath. If Ni is plated, then it is possible to use sodium hypophosphate and sodium boron hydride as reducing agents and use a nickel sulfate bath and a nickel chloride bath.

It is available to form, in the printed wiring board, a through hole for via contact layers connecting interconnections. The method for forming the metal compound layer is not limited. If the metal salt solution is used, the additive is previously applied on the substrate and then cured thereon. Through holes are formed on the substrate. A metal salt solution my be applied onto the substrate. Alternatively, the substrate may be immersed in the metal salt solution. Thereafter, the substrate is dried and heated if any.

On the other hand, if the metal oxide particles are used, through holes which are one size larger than those formed when the metal salt solution is used. The additive containing the metal oxide particles is applied on the surface of the substrate and fill up within the through holes. The additive is then cured. Through holes are again formed which have a predetermined diameter. In place of forming the metal oxide layer only on the substrate surface, it is available that the substrate resin contains the metal oxide particles. In this case, there is no process for forming the through holes in the substrate.

As described above, the additive is applied on the surface of the insulating substrate and then a surface of the applied additive is made rough. A metal compound layer, having a sufficient insulating property and a potential ability at showing a reduction to metal, is formed on the rough surface of the additive. Alternatively, the additive layer is formed on the insulating substrate wherein the additive layer centuries the metal compound particles having a sufficient insulating property and a potential ability at showing a reduction to metal. Thereafter, the surface of the additive layer is made rough and simultaneously surfaces of the particles are exposed so as to form a metal compound layer on the surface of the additive layer on the substrate. The metal compound layer is then selectively reduced to form metal wiring patterns. A palladium-displacement plating layer is formed on the metal wiring pattern. An electroless plating layer is then formed on the palladium-displacement plating. The above methods are free from any problems with the deterioration of the plating deposition and the reduction of the surface resistance due to the adhesion of catalyst on the surface of the plating resist. The above methods are available to form fine wiring patterns by the electroless plating at a low cost.

EXAMPLES

Example 1

Through holes arc formed by drilling in a glass cloth epoxy resin substrate EL-8762AD with double side additives which is commercially available from Sumitomo Bakelite Co., Ltd. The substrate is dipped into a solution containing a nixed acid comprising chromate acid of 300 g/l and sulfuric acid of 200 cc/l at a temperature of 60° C. for ten minutes so as to make the surface of the additive rough. After washing the substrate by water and dried at a temperature of 100° C., the substrate is immersed into a solution containing 0.02M zinc nitrate for three minutes. The substrate is then dried at a temperature of 100° C. The substrate is further heated at a temperature of 150° C. for thirty minutes. A wiring pattern is formed on the substrate by using a dry film SR-3000 commercially available from Hitachi Kasei Kogyo Ltd. The substrate is then immersed into a solution including 0.03M of sodium boron hydride at a normal temperature for five minutes so that zinc compounds are reduced. After wasting the substrate with water, the substrate is then dipped in a hydrochloride acid solution having a pH of 2 and containing 0.001M palladium chloride for one minute so that zinc is displaced with palladium and thus a palladium displacement plating is carried out. After washing the substrate by water, the substrate is subjected to an electroless plating which uses an electroless copper plating bath KC-500 commercially available from Japan Energy Co., Ltd., at a temperature of 72° C. for six hours to thereby form a copper plating is deposited which has a thickness of 35 micrometers.

No copper plating deposition on the resist surface was observed. A predetermined fine wiring pattern was observed. The measured surface resistance was $1 \times 10^{14}$ Ω.

Example 2

An epoxy resin (FR-4) varnish is uniformly mixed with particles of nickel oxide having a diameter of 1.5 micrometers in the average, wherein larger particles having a diameter of not less than 10 micrometers are excluded. A weight ratio of the epoxy resin (FR-4) varnish to the nickel oxide particles is 3:7. This mixture is confirmed into a glass cloth to form a preprug having a thickness of approximately 100 micrometers. Sixteen sheets of the glass clothes containing the above mixture are laminated and then subjected to a pressure heat treatment to thereby form the lamination board. As an epoxy base additive, an MEK solution is prepared which is mixed with a nitric rubber containing nickel oxide particles at 70 percents by weight. The MEK solution is applied on the lamination board and then cured thereon. Thereafter, through holes are formed in the substrate. A surface of the substrate is made rough using conditioner, promoter and neutralizer thereby exposing surfaces of nickel oxide particles. The substrate is washed by water and then dried at a temperature of 100° C. Photosensitive additive, commercially available from Tokyo Applied Chemicals Co., Ltd., is applied on each side of the substrate. The substrate is then pre-baked at a temperature of 90° C. for five minutes by a hot plate. An exposure is carried out at 150 mj and then a development is made using an organic alkyl solution. Thereafter, a photo-selling is carried out. The substrate is immersed into a solution containing 0.03M of potassium boron hydride at a normal temperature for five minutes to cause a reduction of the surfaces of the nickel oxide particles. After washing the substrate with water, the substrate is then dipped in a hydrochloride acid solution having a pH of 2 and containing 0.001M palladium chloride for one minute so flint nickel is displaced with palladium and thus a palladium displacement plating is carried out. After washing the substrate by water, the substrate is subjected to an electroless plating which uses an electroless copper plating bath KC-500 commercially available from Japan Energy Co., Ltd., at a temperature of 72° C. for six hours to thereby form a copper plating is deposited which has a thickness of 35 micrometers.

No copper plating deposition on the resist surface was observed. A predetermined fine wiring pattern was observed. The measured surface resistance was $5 \times 10^{14}$ Ω.

Whereas modifications of the present invention will be apparent to a person having ordinary skill in the all, to which the invention pertains, it is to be understood that embodiments shown and described by way of illustrations are by no means intended to be considered in a limiting sense.

Accordingly, it is to be intended to cover by claims all modifications which fall within the spirit and scope of the invention.

What is claimed is:

1. A printed wiring board comprising:

an epoxy resin substrate;

a metal salt layer which is insulative and formed on said epoxy resin substrate;

a metal wiring pattern selectively formed on said metal salt layer, said metal wiring pattern being formed by a selective reduction of said metal salt layer;

a palladium-displacement plating layer formed on said metal wiring pattern; and an electroless metal plating layer formed on said palladium-displacement plating layer.

2. The printed wiring board as claimed in claim 1, wherein said metal salt layer comprises a metal salt selected from the group consisting of zinc nitrate, nickel nitrate, iron nitrate, copper nitrate, zinc sulfate, nickel sulfate, iron sulfate, copper sulfate, zinc oxalate, nickel oxalate, iron oxalate, copper oxalate, zinc acetic acid, nickel acetic acid, iron acetic acid and copper acetic acid.

* * * * *